(12) United States Patent
Holcomb

(10) Patent No.: US 6,420,318 B1
(45) Date of Patent: *Jul. 16, 2002

(54) CERAMIC SUPERCONDUCTOR/METAL COMPOSITE MATERIALS EMPLOYING THE SUPERCONDUCTING PROXIMITY EFFECT

(75) Inventor: Matthew J. Holcomb, Manhattan Beach, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/433,267

(22) Filed: Nov. 4, 1999

Related U.S. Application Data

(63) Continuation-in-part of application No. 08/806,697, filed on Feb. 26, 1997, now Pat. No. 5,998,336.

(51) Int. Cl.$^7$ ............................ H01L 39/00; H01B 12/00
(52) U.S. Cl. ................. 505/124; 505/236; 505/470; 505/490; 505/500; 428/403; 428/404; 428/457; 428/697; 428/699; 428/702; 428/555; 428/558; 428/930; 29/599; 174/125.1; 252/514; 252/518.1
(58) Field of Search ............................... 505/124, 230, 505/236, 237, 450, 470, 490, 500, 806; 428/403, 404, 457, 689, 697, 699, 701, 702, 553, 555, 558, 930; 29/599; 174/125.1; 252/514, 518.1

(56) References Cited

U.S. PATENT DOCUMENTS

| | | | |
|---|---|---|---|
| 4,971,944 A | 11/1990 | Charles et al. | 505/1 |
| 5,041,416 A | 8/1991 | Wilson | 505/1 |
| 5,081,072 A | 1/1992 | Hosokawa et al. | 505/1 |
| 5,091,362 A | 2/1992 | Ferrando | 505/1 |
| 5,132,278 A | 7/1992 | Stevens et al. | 505/1 |
| 5,194,420 A | 3/1993 | Akihama | 505/1 |
| 5,202,307 A | 4/1993 | Hayashi | 505/1 |
| 5,547,924 A | 8/1996 | Ito et al. | 505/500 |
| 5,998,336 A | * 12/1999 | Holcomb | 505/124 |

FOREIGN PATENT DOCUMENTS

WO 9838684 9/1998

* cited by examiner

Primary Examiner—Marie Yamnitzky
(74) Attorney, Agent, or Firm—Lumen Intellectual Property Services

(57) ABSTRACT

Superconducting composite materials having particles of superconducting material disposed in a metal matrix material with a high electron-boson coupling coefficient ($\lambda$). The superconducting particles can comprise any type of superconductor including Laves phase materials, Chevrel phase materials, A15 compounds, and perovskite cuprate ceramics. The particles preferably have dimensions of about 10–500 nanometers. The particles preferably have dimensions larger than the superconducting coherence length of the superconducting material. The metal matrix material has a $\lambda$ greater than 0.2, preferably the $\lambda$ is much higher than 0.2. The metal matrix material is a good proximity superconductor due to its high $\lambda$. When cooled, the superconductor particles cause the metal matrix material to become superconducting due to the proximity effect. In cases where the particles and the metal matrix material are chemically incompatible (i.e., reactive in a way that destroys superconductivity), the particles are provided with a thin protective metal coating. The coating is chemically compatible with the particles and metal matrix material. High Temperature Superconducting (HTS) cuprate ceramic particles are reactive and therefore require a coating of a noble metal resistant to oxidation (e.g., silver, gold). The proximity effect extends through the metal coating. With certain superconductors, non-noble metals can be used for the coating.

61 Claims, 9 Drawing Sheets

▲ Nb₃Sn/Lead
■ Nb₃Sn/Indium
○ Nb₃Sn/Aluminum
● Nb₃Sn/Silver

CERAMIC SUPERCONDUCTOR/METAL COMPOSITE MATERIALS EMPLOYING THE SUPERCONDUCTING PROXIMITY EFFECT

CROSS-REFERENCE TO RELATED APPLICATIONS

This application is a continuation-in-part of U.S. patent application Ser. No. 08/806,697 filed Feb. 26, 1997, now U.S. Pat. No. 5,998,336, which is incorporated herein by reference.

The development of this invention was supported in part by grant number DEFG03-86ER45245-A012 from the U.S. Department of Energy. The United States Government has certain rights in the invention.

FIELD OF THE INVENTION

The present invention relates to ceramic superconductors and composite materials incorporating ceramic or other brittle superconductor materials. The invention relates to many superconductor materials including but not limited to perovskite/cuprate superconductors, A15 compounds, Laves phase superconductors and Chevrel phase superconductors.

BACKGROUND OF THE INVENTION

The discovery of high critical temperature ($T_c$) superconducting ceramics (HTS ceramics) has inspired an enormous interest in their application. Conventional niobium alloy superconductors such as NbTi must be cooled to below 10 K to achieve useful superconductivity. HTS superconductors, on the other hand, can have $T_c$s over 100 K. Due to the great expense of cryogenic refrigeration, the HTS ceramics could find much wider application in industrial and laboratory devices. Of particular interest are materials which have $T_c$ above 77 K, because this is the temperature of liquid nitrogen, a common and relatively inexpensive refrigerant. HTS ceramics have not been used in many potential applications because they suffer from a number of shortcomings. The most severe problems with the HTS ceramics are as follows:

1) HTS ceramics are brittle. They are not flexible and thus cannot be made into wires or other useful shapes. Cracks and boundaries between adjacent crystals severely limit supercurrent flow.
2) HTS ceramics are highly anisotropic. Supercurrents preferentially flow in certain directions with respect to the crystal lattice, reducing the maximum current density in randomly oriented multicrystalline pieces.
3) HTS ceramics are strong oxidizing agents. Most metals, such as copper, lead, tin, aluminum, indium and niobium, are oxidized by contact with the ceramic superconductors. Insulating oxide layers impede supercurrent flow. Only noble metals such as gold, silver, palladium and their alloys are not oxidized by the HTS ceramics.

A less severe undesirable feature of the HTS ceramics is that they can lose their superconducting properties under certain circumstances. The superconducting structure inside the HTS ceramics has an abundance of oxygen atoms which are necessary for superconductivity. Heating, grinding, etching, or prolonged exposure to ambient atmosphere or vacuum may liberate the oxygen and destroy superconductivity. Both the oxygen content and the superconductivity can be restored by annealing the HTS ceramic in an atmosphere of oxygen.

It would be an advance in the art of applied superconductivity to provide a superconducting wire employing HTS ceramics that is ductile, has a high $T_c$, and has a high critical current density ($J_c$). Such a wire must overcome the problems with the HTS ceramics. Prior art HTS ceramic wires made of a combination of HTS ceramic particles in a silver matrix generally have poor superconducting properties such as low $J_c$. Also, bending the prior art wires tends to greatly reduce the $J_c$. This is highly undesirable.

There are other superconductor materials which have some of the same disadvantages as the HTS cuprate materials. For example, the A15 family of superconductors such as $Nb_3Sn$ are also brittle materials (although they are not anisotropic and relatively nonreactive). Their poor mechanical properties have precluded their use in many applications requiring ductility such as wires. This is unfortunate because they generally have good superconducting properties such as relatively high $T_c$s, high critical magnetic fields, and high critical current densities.

Other examples of brittle, nonductile superconductors include materials possessing the NaCl crystal structure (the AB family), Laves phase materials, and Chevrel phase materials. These materials may have superior superconducting properties, but are unusable in many applications (e.g., conducting wires) because they are brittle. It would be an advance in the art of applied superconductivity to provide flexible wires made from brittle superconductor materials.

U.S. Pat. No. 5,091,362 to Ferrando discloses a method for forming a silver coating on HTS ceramic particles. U.S. Pat. No. 4,971,944 to Charles et al. teaches a method for electroless deposition of gold onto HTS ceramic particles.

U.S. Pat. No. 5,041,416 to Wilson describes a superconducting composite material. Powders of HTS ceramic and normal metal are mixed and the mixture is subjected to heat and high pressure. The composite materials of Wilson have a relatively low $J_c$ due to reactivity between the HTS ceramics and the metal matrix. The wires also have a low $J_c$ if silver is used as the normal metal.

U.S. Pat. No. 5,202,307 to Hayashi describes a superconducting composite material having HTS ceramic particles in a metal matrix. The composite materials of Hayashi have a relatively low $J_c$ due to reactivity between the HTS ceramic particles and the metal matrix and/or due to poor superconducting properties of the metal matrix materials.

U.S. Pat. No. 5,194,420 to Akihama describes a composite cuprate superconductor/metal superconducting material consisting of HTS ceramic particles dispersed in a matrix of silver. The composite materials of Akihama will also have a relatively low critical current density due to the choice of silver as the metal matrix material.

U.S. Pat. No. 5,081,072 to Hosokawa et al. describes a method of preparing a HTS superconducting ceramic powder and forming the powder into a superconducting material. A low $J_c$ is also a problem with the materials of Hosokawa.

U.S. Pat. No. 5,547,924 to Ito et al. describes a superconducting ceramic composite material having HTS ceramic particles in a noble metal matrix. The composite materials have relatively poor superconducting properties due to the poor superconducting properties of the metal matrix materials used.

U.S. Pat. No. 5,132,278 to Stevens et al. describes a cuprate superconductor wire having continuous filaments of HTS ceramic surrounded by a metal matrix. A noble metal chemically protects the HTS ceramic. The wires of Stevens et al. are characterized in that they do not conduct current between wires, and do not rely on the superconducting proximity effect.

There exists a need for a HTS ceramic superconducting material that is ductile and has a high $J_c$ that is not reduced by bending. Also, there exists a need for ductile superconducting materials made from brittle superconductors that have a high $J_c$, high $T_c$, and high ductility.

SUMMARY OF THE INVENTION

These objects and advantages are provided by a superconducting composite material having superconductor particles made of superconductor material disposed in a metal matrix material. The superconductor particles have dimensions larger than the superconducting coherence length of the superconductor material. The metal matrix material has an electron-boson coupling (typically electron-phonon coupling) coefficient greater than 0.2. The superconductor particles are coupled by a continuous superconducting path due to the proximity effect when the composite material is cooled below the critical temperature of the superconductor particles.

The superconductor particles preferably have dimensions in the range of about 2 nanometers to 10 microns, more preferably in the range of 10–500 nanometers. Larger particle sizes may also be used. The superconductor particles can be made of various superconductors including A15 compounds, AB family superconductors, Laves phase superconductors, Chevrel phase superconductors, and HTS ceramic superconductors. In the present specification, an HTS superconductor is a superconductor with a $T_c$ greater than 30 Kelvin. The cuprate superconductors are well known examples of HTS superconductors.

The metal matrix material preferably has a high electron-phonon coupling coefficient, $\lambda$. All else being equal, the $\lambda$ of the metal matrix material is preferably greater than 0.2, more preferably greater than 0.5, yet more preferably greater than 1.0, and most preferably greater than 1.5 (i.e., higher values are more preferred). The metal matrix material can be made, for example, of niobium, indium, NbTi alloy, tin, lead, lead/bismuth alloys, mercury, tantalum, titanium, vanadium, titanium/bismuth alloys, lead/titanium alloys and alloys thereof. All these materials have $\lambda$ values greater than 0.5.

The metal matrix material can be pure elemental metal, or an alloy. The metal matrix material can comprise a mixture of different metals, in which case the metal matrix material can even include materials having low $\lambda$ values (e.g., metals with $\lambda$ values less than 0.2 such as silver). This allows control over certain properties of the composite material (e.g., n-value, $T_c$, and $J_c$).

In another embodiment of the present invention, the superconductor particles have a metal coating separating the superconductor particles from the metal matrix material. The coating is preferably thick enough to prevent chemical reactions between the superconductor particles and metal matrix material. The coating is highly preferred in embodiments where the superconductor particles and the metal matrix material are chemically incompatible. The coating is chemically compatible with the superconducting particles and the metal matrix material. In the present description, 'chemically compatible' means that the metal coating does not destroy the superconducting properties of the superconductor particles and does not destroy the superconducting properties of the metal matrix material. Also, being "chemically compatible" means that the metal coating does not form an insulating layer at the interfaces. A small amount of degradation is within the scope of the present invention.

The superconductor particles can be made of HTS ceramics. Most HTS ceramic particles require a metal coating because most HTS ceramics are chemically reactive with high-$\lambda$ metals. The coating preferably is made of a noble metal (e.g., silver, gold, palladium, or an alloy thereof) that is not oxidized by contact with the HTS ceramic.

The metal coating is preferably as thin as possible. The metal coating is preferably thinner than the electron mean free path of the metal coating material at the $T_c$ of the superconductor particles. More preferably, the metal coating is thinner than the proximity effect decay length of the metal coating at the $T_c$ of the superconductor particles. The coating is preferably in the range of 2–3000 nanometers thick, more preferably in the range of 2–50 nanometers thick. Alternatively, the metal coating is preferably thinner than the electron mean free path of the metal coating material at 4.2 Kelvin. Also, the metal coating is preferably thinner than the proximity effect decay length at 4.2 Kelvin.

DETAILED DESCRIPTION

The present invention provides composite superconducting materials that are flexible, ductile and have exceptional superconducting properties (high critical temperature and high critical current density). The composite materials according to the present invention have superconductor particles dispersed within a metal matrix material. The superconductor particles are made of superconducting material. The metal matrix material preferably has an electron-boson coupling coefficient of at least 0.2, so that it is susceptible to the superconducting proximity effect. The metal matrix material becomes superconducting due to the proximity effect at temperatures below the critical temperature of the superconductor particles. Preferably, the superconductor particles are disposed close enough so that all the metal matrix material is superconducting at temperatures below the critical temperature of the superconductor particles.

Figure 1:
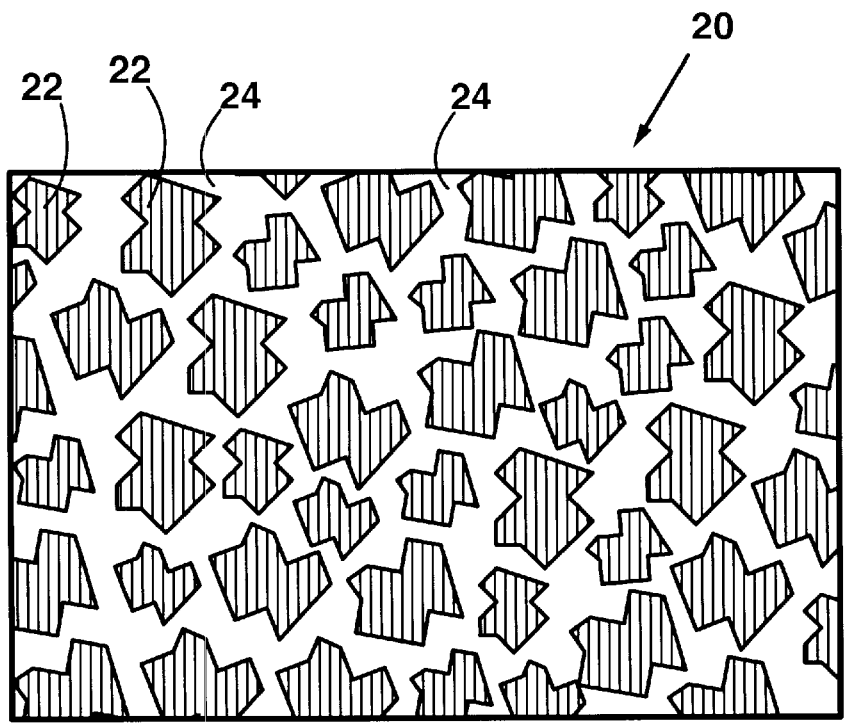
FIG. 1 is a cross-sectional view of an embodiment of the present invention having superconducting particles disposed in a metal matrix material.

FIG. 1 shows a magnified view of a composite material 20 according to the present invention. The composite material 20 has superconductor particles 22 made of brittle superconducting material disposed in a metal matrix material 24. The superconductor particles 22 can have a wide range of sizes, and the sizes of the particles 22 do not need to be uniform. The particles preferably have sizes generally within the range of 1.5 nanometers to 10 microns in diameter, for example. The particles 22 are made of a brittle superconducting material, such as an A15 compound, AB family superconductors, Laves phase superconductors, Chevrel phase superconductors or the like. Preferably, the particles are made of a material having a relatively high critical temperature (e.g., greater than 15–20 Kelvin), and a relatively high critical current density (e.g., greater than 100 kA/cm$^2$). Also preferably, the particles have high critical magnetic fields (e.g., greater than 5T). In general, the superconductor particles preferably have robust superconducting properties.

There are preferably no insulating contaminants between the superconductor particles 22 and the metal matrix material 24. A thin layer of grease, oxide or any other insulating material between the superconductor particles and metal matrix material can seriously degrade the superconducting properties of the composite material 20 by impeding supercurrent flow through the superconductor particle/metal matrix interface.

The particles 22 preferably have dimensions larger than the superconducting coherence length of the superconducting material. Preferably, the superconductor particles have dimensions of about 3–500 times the superconducting coherence length of the superconductor particles, more preferably, the superconductor particles are about 5 to 10 times larger than the superconducting coherence length of the superconducting material. For most superconductor particle materials, it is preferable for the intrinsic superconductor particles to have dimensions less than 10 microns. The best size range depends upon the temperature at which the composite material is used, the $\lambda$ of the metal matrix material, the superconductor coherence length of the superconductor particles, the proximity effect decay length of the metal matrix material, and the inelastic mean free path of the metal matrix material (explained below), and possibly other factors.

For example, the A15 superconducting compounds (e.g., Nb$_3$Sn, Nb$_3$Ge, Nb$_3$Al, V$_3$Ga, V$_3$Si, V$_3$Al, V$_3$In, Nb$_3$Ga, V$_3$Ge, Nb$_3$Ge, Nb$_3$Si, Ta$_3$Pb, Ta$_3$Au, and Mo$_3$R) generally have superconducting coherence lengths of approximately 2–3 nanometers. Therefore, for A15 compounds, the superconductor particles preferably have dimensions greater than 2–3 nanometers. For A15 compounds, particle sizes are preferably in the range of 10–5000 nm, or more preferably 10–500 nanometers. Larger sizes are also possible, but are typically less preferred because they may produce composites having less than optimal superconducting and mechanical properties.

Table 1 below lists several candidate materials useful for the intrinsic superconductor particles, their coherence lengths and their critical temperatures.

TABLE 1

Candidate materials for the superconductor particles.

| Superconductor | Family/Phase | Critical Temperature | Coherence Length |
|---|---|---|---|
| A15 Compounds | AB | 11–25K | 2–3 nm |
| MoC | AB | 14.3K | |
| NbN | AB | 17.3 K | 4.0 nm |
| ZrN | AB | 10.7K | |
| CaRh$_2$ | Laves | 6.4K | |
| CaIr$_2$ | Laves | 6.2K | |
| ZrV$_2$ | Laves | 9.6K | 4.5 nm |
| HfV$_2$ | Laves | 9.4K | 3.9 nm |
| Mo$_6$S$_8$ | Chevrel | 1.6K | |
| Cu$_2$Mo$_6$S$_8$ | Chevrel | 10.7K | |
| LaMo$_6$S$_8$ | Chevrel | 6.6K | 7.8 nm |
| Yb$_{1.2}$Mo$_6$S$_8$ | Chevrel | 8.7K | |
| La$_2$Mo$_6$S$_8$ | Chevrel | 11.7K | |
| Pb$_{0.9}$Mo$_6$S$_{7.5}$ | Chevrel | 15.2K | 2.0 nm |
| PbMo$_6$S$_8$ | Chevrel | 12.6K | 2.3 nm |
| BrMo$_6$S$_8$ | Chevrel | 13.8K | |

It is noted that coherence length values for certain superconductor materials are unavailable.

Materials useful for the superconductor particles are not necessarily limited to those listed in Table 1.

The metal matrix material 24 is preferably made of a ductile metal (elemental metal, metal alloy, or metal mixture) that is susceptible to the superconducting proximity effect. In order to be susceptible to the proximity effect, the metal matrix material preferably has a high electron-boson coupling coefficient $\lambda$ (a unitless number). The electron-boson coupling coefficient $\lambda$ is generally dominated by electron-phonon coupling, but coupling to other bosons (e.g., plasmons, magnons, spinons) can also play a role in increasing the $\lambda$ of a material. The metal matrix material preferably has a $\lambda$ greater than 0.2. More preferably, the metal matrix material has a $\lambda$ greater than 0.5, and most preferably the metal matrix material has a $\lambda$ greater than 1.0. All else being equal, the higher the $\lambda$, the better. This is because the susceptibility to the proximity effect increases with $\lambda$. Table 2 below shows candidate matrix materials and their electron-phonon coupling coefficients.

TABLE 2

Candidate metal matrix materials

| Metal | Electron-Phonon Coupling, $\lambda$ |
| --- | --- |
| Lead | 1.55 |
| Tin | 0.72 |
| NbTi | 0.92 |
| Niobium (Nb) | 1.22 |
| Mercury | 1.62 |
| Tantalum | 0.69 |
| Titanium | 0.8 |
| Vanadium | 0.8 |
| Indium | 0.81 |
| $Ti_{0.9}Bi_{0.1}$ | 0.78 |
| $Pb_{0.4}Ti_{0.6}$ | 1.38 |
| $Pb_{0.9}Bi_{0.1}$ | 1.66 |
| $Pb_{0.75}Bi_{0.25}$ | 2.76 |
| $Pb_{0.7}Bi_{0.3}$ | 2.01 |
| Lead/Indium Alloys | >1.5 |
| Lead/Bismuth Alloys generally | 2–3 |

Metals useful for the metal matrix material are not necessarily limited to those listed in Table 2. Many of the metal matrix materials in Table 2 are elemental materials (e.g., Lead, Tin, Niobium). These elemental materials are typically Type I superconductors and generally are not suitable for use in high magnetic field applications. For high magnetic field applications, Type II superconductors (e.g., metal alloys) should be used for the metal matrix materials. Examples of Type II alloys are NbTi and Lead-Bismuth alloys. Also, it is known that some elemental metals act as Type II superconductors if under sufficient mechanical stress. Stressed Niobium, for example, acts as a Type II superconductor and can be used as a metal matrix material in high magnetic field applications, though well annealed, unstressed niobium is a classic Type I superconductor.

Also, the metal matrix material preferably has a long proximity effect decay length. The proximity effect decay length is a fundamental material property. The decay length is a result of dephasing of electron and hole wave functions as they travel through the matrix material (due to different electron and hole velocities). The decay length is typically not as important as $\lambda$ because most candidate materials have similar decay lengths. Table 3 shows decay lengths for selected candidate materials. It is noted that the decay length is inversely proportional to absolute temperature.

TABLE 3

| Metal | Proximity Effect Decay Length at 77K, in nm |
| --- | --- |
| Lead | 29 |
| Tin | 30 |
| NbTi | 22 |
| Niobium (Nb) | 22 |
| Mercury | 25 |
| Indium | 28 |
| Lead/Bismuth Alloys | 25–28 |

The superconductor particles 22 preferably have a critical temperature higher than the critical temperature of the metal matrix material 24.

Figure 2:
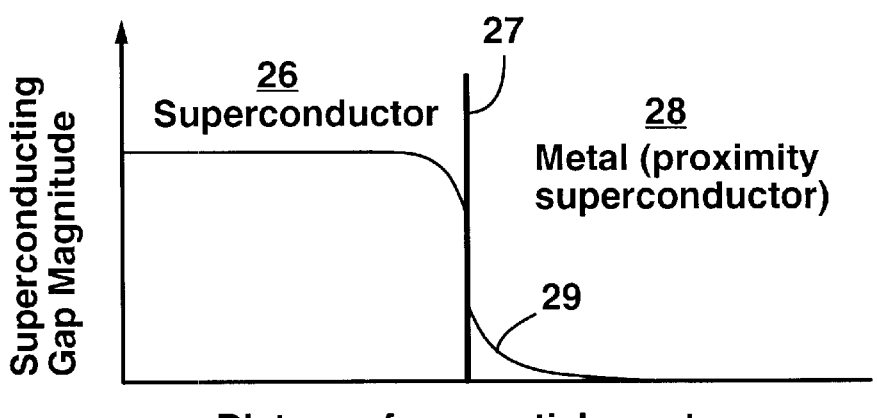
FIG. 2 is a graph illustrating the variation of the superconducting gap magnitude near a boundary between a superconductor and a metal.

FIG. 2 shows a diagram illustrating the superconducting proximity effect as it occurs at a boundary 27 between a superconductor 26 and a metal 28 susceptible to the proximity effect. A superconducting gap magnitude provides a measure of superconductivity. The superconducting gap magnitude is proportional to the critical temperature and the critical current density in a superconducting material. In the metal the gap magnitude 29 is relatively high close to the boundary 27, and decreases with distance from the boundary. The metal 28 is superconducting close to the boundary 27 due to contact with the superconductor 26. The superconducting gap magnitude in the metal decreases with increasing distance from the boundary 27. The characteristic length of the decay of the superconducting gap magnitude in the metal is the proximity effect decay length.

Figure 3:
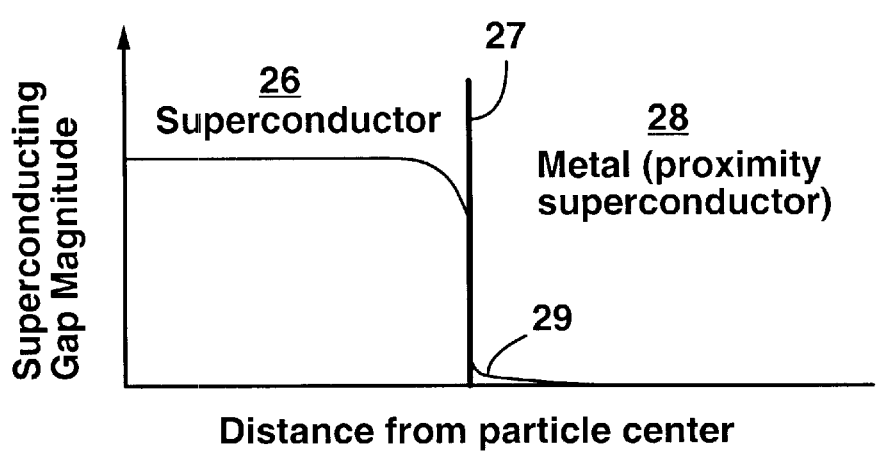
FIG. 3 is a graph illustrating the variation of the superconducting gap magnitude near a boundary between a superconductor and a metal having a low $\lambda$ value.

FIG. 3 shows a diagram illustrating the superconducting gap magnitude in the case where the metal has a low electron-phonon coupling coefficient (i.e., $\lambda$ less than 0.2). The gap magnitude 29 in the metal is relatively small, and therefore the metal has a relatively small critical current density. The metal has poor superconducting properties due to the low $\lambda$ value. The metal in this case has poor superconducting properties. Examples of materials with low $\lambda$ include silver ($\lambda$=0.14), gold ($\lambda$=0.14), and copper ($\lambda$=0.08). These materials are very good conductors, but have poor superconducting properties. Therefore, they are preferably not used as the metal matrix material.

Figure 4:
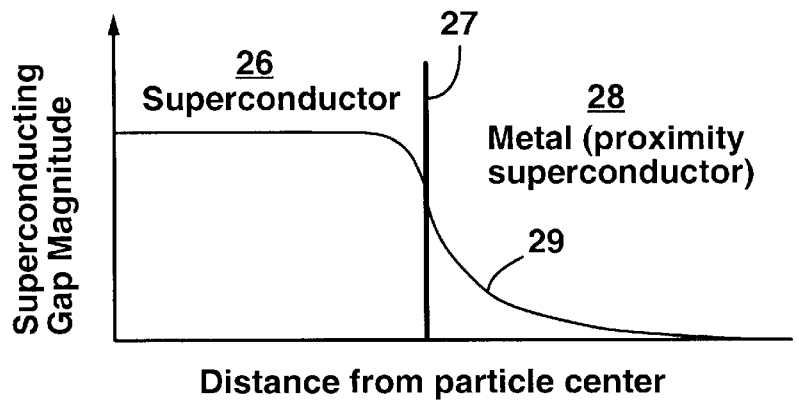
FIG. 4 is a graph illustrating the variation of the superconducting gap magnitude near a boundary between a superconductor and a metal having a high $\lambda$ value.

FIG. 4 shows a diagram illustrating the superconducting gap magnitude in the case where the metal has a high $\lambda$ value (i.e., $\lambda$ greater than 1.0). The gap magnitude 29 in the metal is relatively large compared to the gap magnitude in FIG. 3. The high $\lambda$ results in the metal having a larger critical current density extending deeper into the metal layer. The proximity decay length of the metal also plays a role; the proximity decay length describes the characteristic decay length of the proximity effect. A long proximity decay length causes the superconducting gap to penetrate deeply into the metal. A longer proximity decay length thus increases the volume of the metal layer with a large gap magnitude 29.

Figure 5:
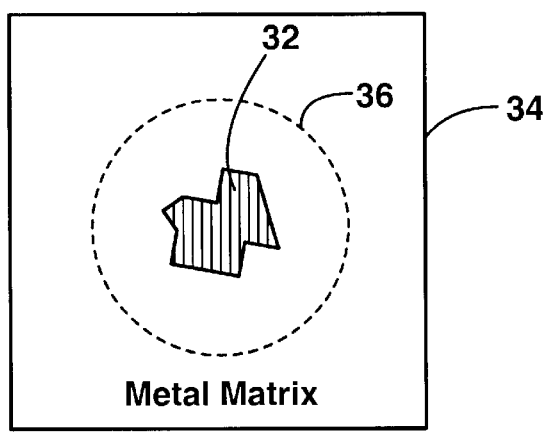
FIG. 5 illustrates the extent of the superconducting proximity effect around a particle of superconducting material disposed within a metal matrix.

In the present invention (e.g., the embodiment shown in FIG. 1), the superconductor particles 22 are superconducting at the operating temperature, and the metal matrix material is induced superconducting through the superconducting proximity effect, even though its superconducting transition temperature may be below the operating temperature. FIG. 5 shows a single isolated superconductor particle 32 disposed in a block 34 of metal matrix material. When cooled below the critical temperature of the particle 32 (but not necessarily below the critical temperature of the metal matrix material block 34), the superconductor particle 32 causes portions of the block close to the superconductor particle to become superconducting due to the proximity effect. Circle 36 illustrates the approximate range of the proximity effect. The circle 36 is relatively large if the metal matrix material has a high $\lambda$ value and long proximity decay length; the circle is relatively small if the metal matrix material has a small $\lambda$ value and/or short proximity decay length. If the metal matrix material block is made of silver, gold, or copper, for example, the circle 36 will extend only a very small distance beyond the surface of the superconductor particle and the block will have essentially no useful superconductivity.

Figure 6:
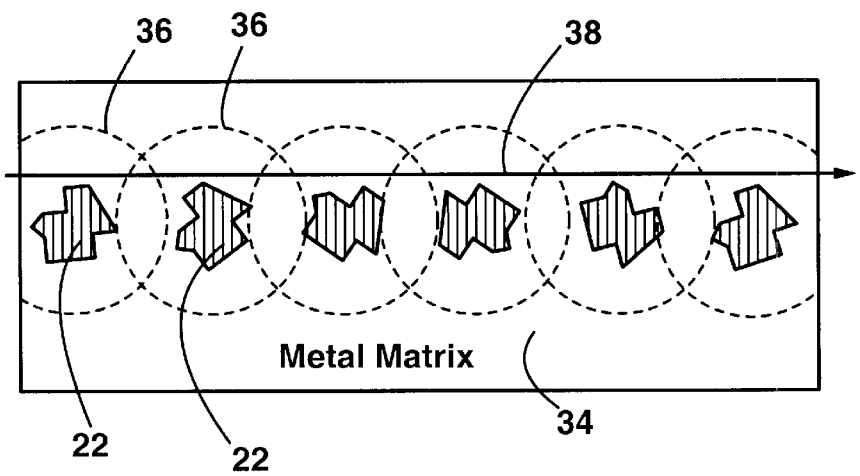
FIG. 6 shows how a number of superconducting particles disposed in a metal matrix provide a continuous supercurrent path through the matrix material.

FIG. 6 shows an idealized embodiment of the present invention in which all the superconductor particles 22 are arranged linearly in the metal matrix material 34. Circles 36 illustrate the approximate range of the superconducting proximity effect within which the superconducting gap has a magnitude great enough to provide a useful critical current density. The particles 22 are close enough so that the circles 36 overlap, thereby providing a continuous path 38 for supercurrent. The overlapping circles imply that the particles 50 are coupled by a continuous superconducting path due to the proximity effect. The path 38 can pass through the superconductor particles 22 and the superconducting regions of the metal matrix, or can pass only through the superconducting regions of the metal matrix material 34. Very large superconductor particles (with dimensions much greater than the range of the proximity effect) are usually not preferred due to 'voids' in the metal matrix material that are larger than the range of the proximity effect. Generally, the superconductor particles are preferably small enough and numerous enough so that substantially all of the metal matrix material is affected by the proximity effect. Of course, the optimum size of the superconductor particles depends somewhat on the volume percent of superconductor particle material versus matrix material, and the temperature at which the composite material is used.

In FIG. 1, the superconductor particles 22 are close enough and numerous enough so that essentially the entire volume of the metal matrix material is induced into a superconducting state by the proximity effect when cooled below the critical temperature of the superconductor particles 22. Therefore, the entire volume of the composite material is superconducting when cooled below the critical temperature of the superconductor particles 22.

An important consideration in the present invention is the relative volume of the superconductor particles and the metal matrix material. The optimal percentages (measured by volume) of superconductor particles and metal matrix material depends greatly on the mechanical and superconducting properties of the materials used, and the desired mechanical and superconducting properties of the composite material. For example, if very high ductility is desired of the composite material, then a high percentage of a very ductile metal matrix material should be used. Generally, the optimal volume percent of metal matrix material increases with increasing $\lambda$.

Also, the temperature at which the composite is to be used has a bearing on the composite design. The proximity effect decay length increases with decreasing temperature. Therefore, for a composite used at very low temperatures, the superconductor particles 22 can be located relatively far apart. If the composite is to be used at relatively high temperatures, then the superconductor particles 22 are preferably located relatively close together.

There are many possible combinations (e.g., thousands) of superconductor particle materials and metal matrix materials within the scope of the present invention. Each possible combination may also be improved or optimized by selecting the best superconductor particle volume/matrix material volume ratio. Also, each material combination may be improved or optimized by selecting the best size range for the superconductor particles. Further, there may be special chemical compatibility issues for certain combinations of superconductor particle materials and metal matrix materials. In general, chemical reactivity between the particles and metal matrix material should be avoided, particularly if the reactivity is destructive to the superconducting properties of the superconductor particles, or if the reactivity is destructive to the superconducting properties of the metal matrix material, or if the reactivity degrades the electrical contact between the superconductor particles and the metal matrix material (e.g., by producing an insulating layer at the particle/matrix interface).

Figure 7:
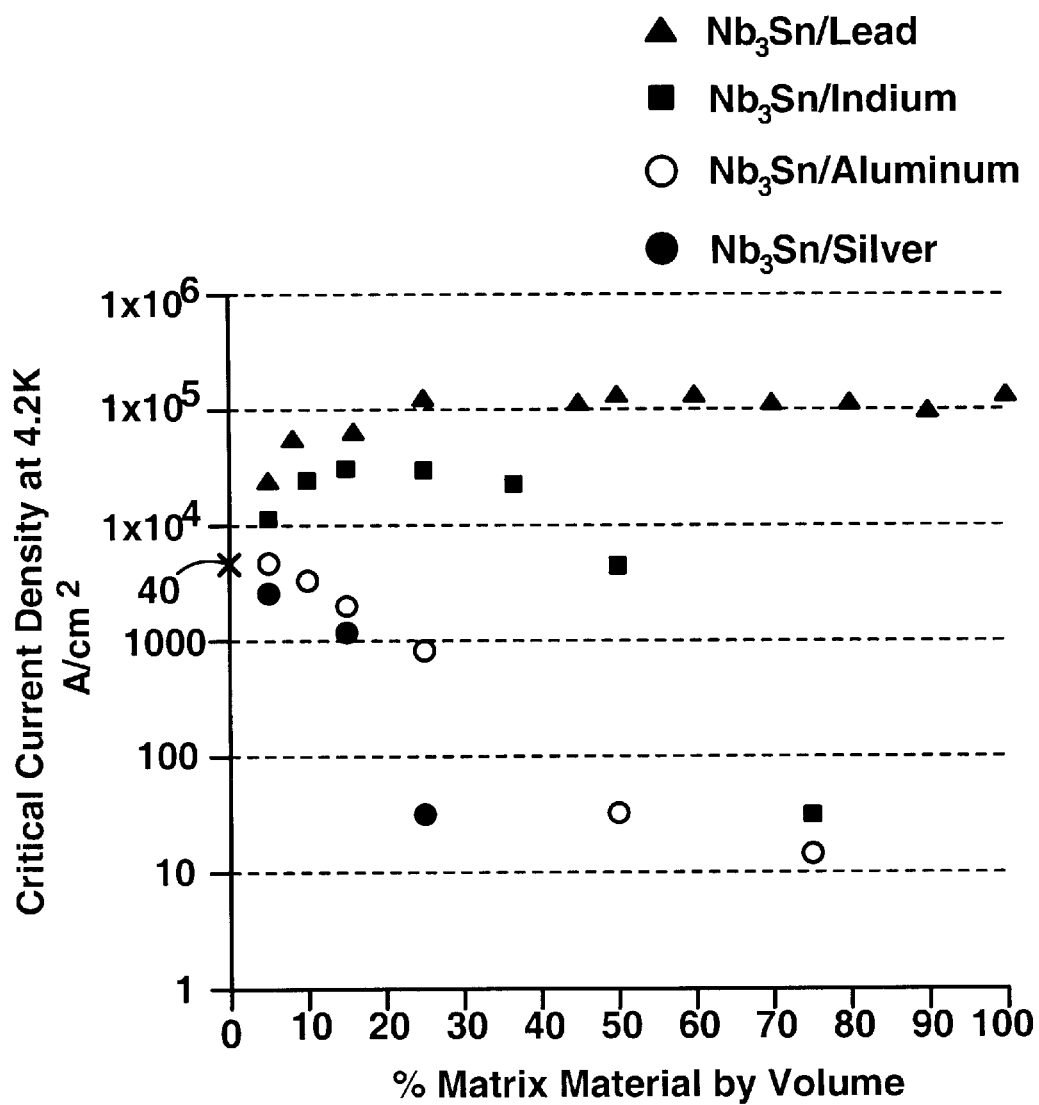
FIG. 7 is a graph of critical current density ($J_c$) versus volume % matrix material for four different matrix materials (silver, aluminum, indium, and lead). The plot illustrates that high $\lambda$ metals are better proximity superconductors than low $\lambda$ metals. The superconductor material used was $Nb_3Sn$.

FIG. 7 shows critical current densities for several different material combinations at 4.2 K. The different material combinations are $Nb_3Sn$ superconductor particles dispersed within silver, aluminum, indium and lead. A cross 40 represents the critical current density for pure compacted $Nb_3Sn$ superconductor particles (e.g., a powder-in-tube $Nb_3Sn$ wire). In all the composites represented in FIG. 7, the $Nb_3Sn$ superconducting particles were −325 mesh, which corresponds to particle sizes in the range of about 1–40 microns. It is possible the critical current densities of the composites could be improved by using superconductor particles with more uniform sizes. The critical current density was determined by the standard 0.1 $\mu$V/cm electric field criterion.

FIG. 7 demonstrates that a composite of $Nb_3Sn$ particles in a silver matrix has a dramatically reduced supercurrent carrying capacity compared to pure compressed $Nb_3Sn$ particles. This is because silver has a very low $\lambda$ and is therefore only very weakly susceptible to the superconducting proximity effect.

Similarly, the composite material which consists of $Nb_3Sn$ superconductor particles embedded in an aluminum matrix has a reduced $J_c$ relative to the pure $Nb_3Sn$ particles because aluminum has a relatively low $\lambda$ of 0.43. However, the composite which consists of $Nb_3Sn$ superconductor particles embedded in an indium matrix has an improved $J_c$ relative to pure $Nb_3Sn$, $Nb_3Sn$/silver, or $Nb_3Sn$/aluminum materials. FIG. 7 indicates that the optimum amount of indium is about 10–35% by volume. Indium improves the $J_c$ of the composite because indium, with a $\lambda$ of 0.81, has a relatively high susceptibility to the superconducting proximity effect. Similarly, lead also improves the $J_c$ of the composite because lead, with a $\lambda$ of 1.55, also has a high susceptibility to the superconducting proximity effect. However, embedding the $Nb_3Sn$ superconductor particles in the lead matrix does not improve the $J_c$ as much as would be expected from its $\lambda$ value. This is because the tin (Sn) within the $Nb_3Sn$ dissociates and dissolves within the lead, thus degrading the $Nb_3Sn$/lead interface and damaging the superconducting properties of the $Nb_3Sn$ particles. Dissociation of the $Nb_3Sn$ tends to offset the $J_c$ improvement provided by the high $\lambda$ of lead. This effect of chemical reactivity is worsened by heating the composite material. Several possibilities for avoiding this effect are discussed below.

Figure 8:
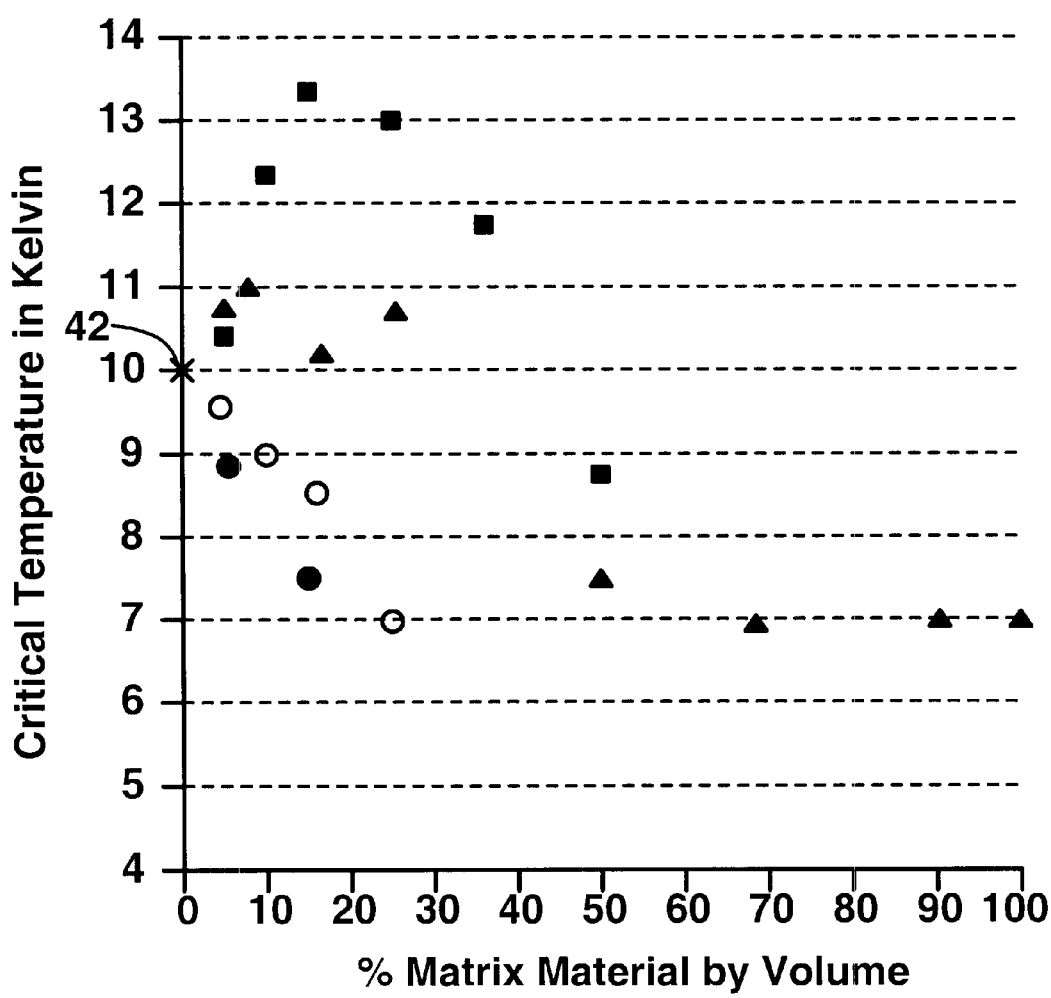
FIG. 8 is a graph of critical temperature ($T_c$) versus volume % matrix material for four different matrix materials (silver, aluminum, indium, and lead).

FIG. 8 shows critical temperatures ($T_c$s) for some of the same composite materials plotted in FIG. 7. Bulk $Nb_3Sn$ has a $T_c$ of 18 K. However, the $T_c$ of pure compacted $Nb_3Sn$ powder is about 10 K, which is indicated in the graph at 42. This low value for $T_c$ reflects the poor inter-particle contact between the $Nb_3Sn$ superconductor particles in a compacted material. FIG. 8 shows that the addition of silver or aluminum to $Nb_3Sn$ particles dramatically decreases the $T_c$ compared to pure compacted $Nb_3Sn$ particles. Aluminum has a $T_c$ of 1.4 K and silver is not superconducting at any temperature. By comparison, indium, which has a $T_c$ of 3.2 K, dramatically increases the $T_c$ of the $Nb_3Sn$/indium composite to over 10 K. This is a striking result considering that indium has a $T_c$ much less than 10 K. Indium increases the $T_c$ of the composite because indium has a relatively high $\lambda$ of 0.81 and is thus quite susceptible to the superconducting proximity effect. Similarly, lead increases the $T_c$ of the $Nb_3Sn$/lead composite because lead has a $\lambda$ of 1.55. The effect of the high $\lambda$ of lead is offset due to the chemical reactivity between lead and $Nb_3Sn$. It is expected that further increases in the critical temperature of $Nb_3Sn$/lead composites would be realized if not for the dissociation of tin from $Nb_3Sn$ when in the presence of lead.

Figure 9:
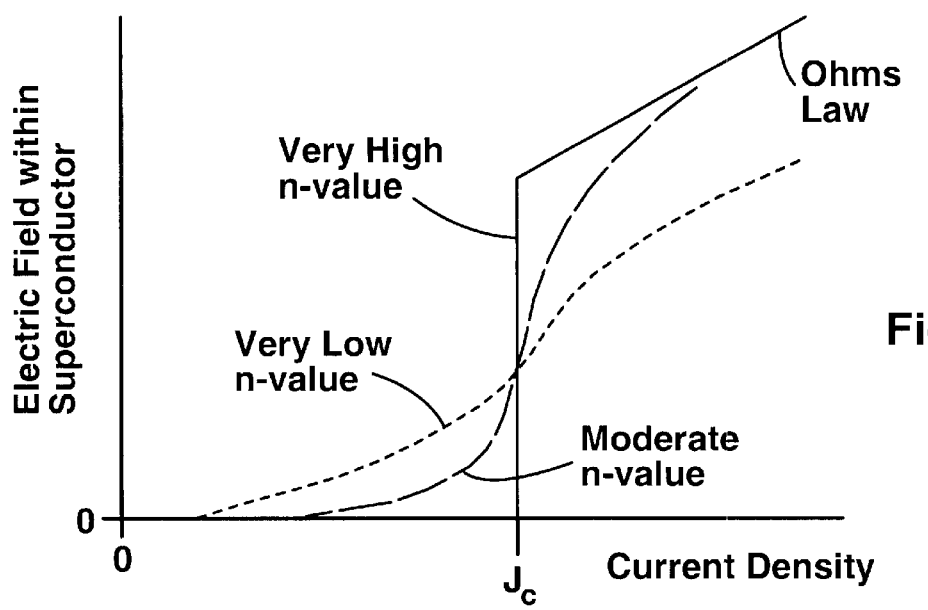
FIG. 9 is a graph of E-field vs. current density, illustrating the meaning of an n-value for a superconducting material, as is known in the art.

The composites of the present invention can be adjusted to have desired 'n-values'. FIG. 9 illustrates the concept of an n-value as is known in the art. The n-value of a superconducting material describes the sharpness of the conversion to the normal state when the critical current density is exceeded. Generally, the n-value is defined by the relation $$V/V_c \approx (I/I_c)^n$$

where I and V are the current and voltage in the wire, $V_c$ is the electric field criterion standard (typically 0.1 $\mu$V/cm), and $I_c$ is the critical current of the composite which is defined as the magnitude of current passing through the composite which results in an electric field of at least $V_c$ existing in the composite. An n-value of 1 corresponds to Ohms Law for a normal resistive metal. The n-value can be an important characteristic for certain superconductor applications. For example, in fault-current limiters for electrical power distribution applications, it is highly desirable to have a very high n-value so that power surges are efficiently attenuated. Such devices are operated very close to $I_c$. A current surge exceeds $I_c$ and pushes the device into normal conduction, thereby absorbing the power surge. The present invention can provide a composite for fault current limiters that have a very high n-value (generally at the expense of a lower $J_c$ or $T_c$). Conversely, superconducting wire for electric motors should have a relatively low n-value so that large, sudden changes in motor impedance are not produced by current surges and so that changes in motor load do not result in current surges. The present invention provides flexibility so that specific n-values can be provided.

Figure 10:
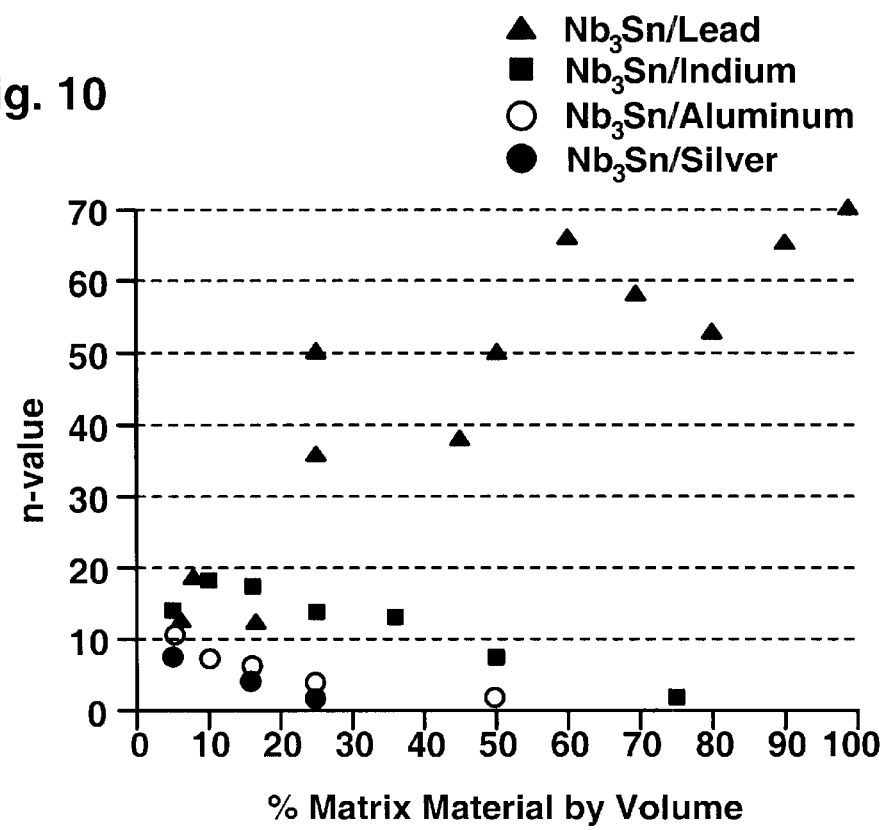
FIG. 10 is a graph of n-value versus volume % matrix material for four different matrix materials (silver, aluminum, indium, and lead).

FIG. 10 plots n-values for several $Nb_3Sn$/metal matrix composites made with silver, aluminum, indium and lead matrix materials. The n-value for a pure compressed $Nb_3Sn$ superconductor particles is about 10. Embedding $Nb_3Sn$ superconductor particles in a matrix of silver or aluminum reduces the n-value compared to pure compressed $Nb_3Sn$ particles. Embedding $Nb_3Sn$ superconductor particles in a matrix of 10–35% indium by volume increases the n-value. Embedding $Nb_3Sn$ superconductor particles in a matrix of lead increases the n-value. The n-value for lead is measured to be about 70. The measured n-values for $Nb_3Sn$/lead composites are not consistent because of variations caused by the reactivity between the $Nb_3Sn$ and lead. Since silver, aluminum, indium and lead have different effects on the n-value, a desired n-value can be produced by using a combination (mixture) of these metals for the matrix material. For example, a combination of lead and silver will produce a wire having a reduced n-value compared to a wire with a matrix of pure lead. By selecting appropriate ratios of different metal matrix materials, a desired n-value is provided.

Figure 11:
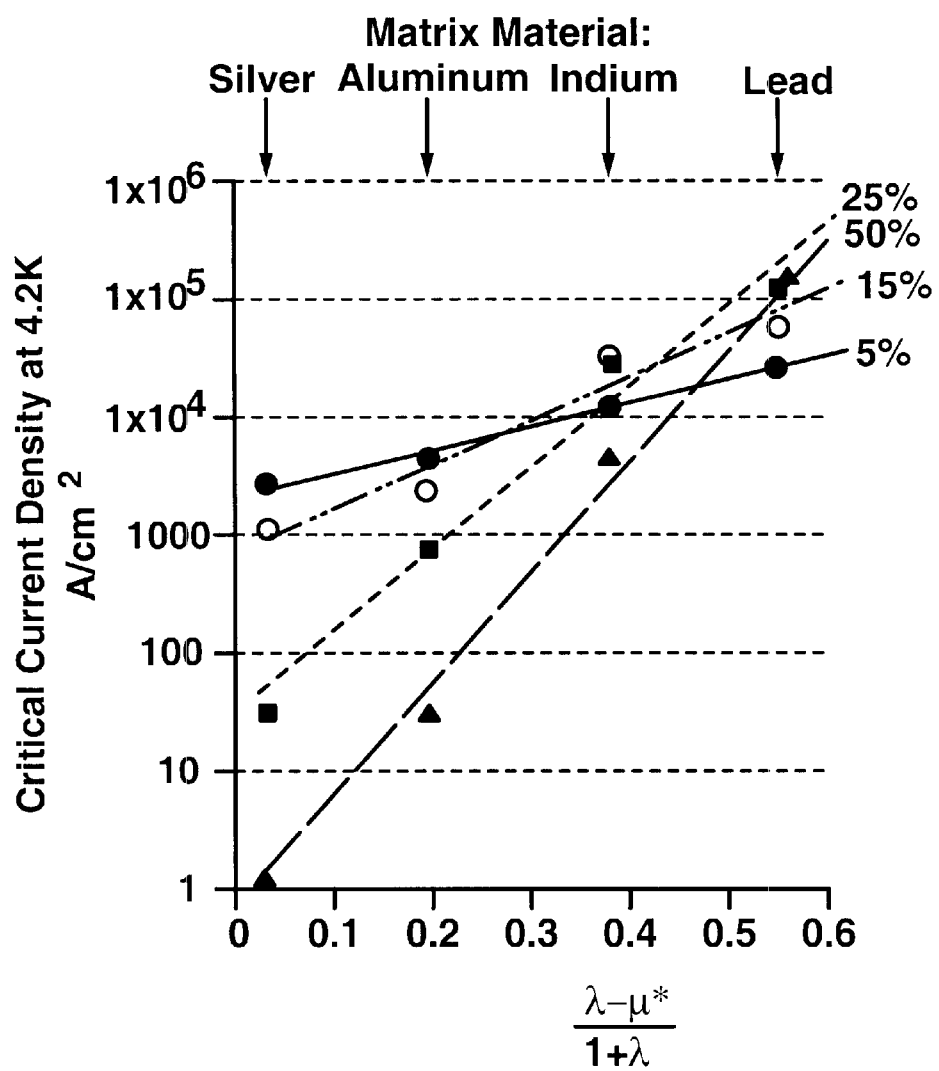
FIG. 11 is a graph of $J_c$ versus normalized electron-phonon coupling constant for different matrix materials.

FIG. 11 shows a graph of the normalized electron-boson coupling constant versus critical current density. The normalized electron-boson coupling constant includes the effect of the screened electron-electron Coulomb repulsion $\mu^*$. For most materials, the screened electron-electron Coulomb repulsion is about 0.1. The normalized electron-boson coupling constant is given by $$(\lambda-\mu^*)/(1+\lambda).$$

The normalized electron-boson coupling constant is proportional to the superconducting gap magnitude in a metal adjacent to a superconductor and therefore is a more accurate measure of proximity effect susceptibility than the electron-boson coupling coefficient $\lambda$. The normalized electron-boson coupling constant values for silver, aluminum, indium, and lead are about 0.03, 0.19, 0.38, and 0.55, respectively. FIG. 11 illustrates that $J_c$ increases strongly with increasing $\lambda$ and normalized electron-boson coupling constant. These results suggest that very high $\lambda$ materials such as lead-bismuth alloys will provide very high $J_c$s significantly exceeding 100 kA/cm² if added to the composite in sufficient quantity. Also, these results suggest that, if all other factors are constant, higher normalized electron-boson coupling constants are always better.

FIG. 11 also demonstrates that too much matrix material strongly reduces the $J_c$ of the composite material unless the normalized electron-boson coupling is very high. The higher the normalized electron-boson coupling constant of the matrix material, the more matrix material can be added without reducing $J_c$. In fact, the higher the normalized electron-boson coupling constant of the matrix material, the higher the optimal volume % of matrix material for maximum $J_c$. In other words, for maximum $J_c$, matrix materials with higher reduced phonon coupling should comprise higher volume % of the composite material. For matrix materials with $\lambda$ in the range of about 1.5–2, it is estimated that the matrix material should comprise about 25–50% of the composite by volume.

The reaction between lead and $Nb_3Sn$ causes degradation of the superconducting properties of $Nb_3Sn$/lead composites. Also, the superconducting properties are unstable and may deteriorate when the composite is exposed to heat which promotes the reaction. Therefore, $Nb_3Sn$/lead does not provide a good superconducting composite. As noted above, the tin dissociates from the $Nb_3Sn$ and dissolves in the lead.

Generally, the A15 compounds tend to be somewhat unstable. If a component of the A15 compound is soluble in the matrix material or binds with the matrix material, then this can promote the dissociation of the A15 compound. For this reason it is best to use A15 compounds having constituents which are insoluble in the metal matrix material or have a low affinity for the metal matrix material. This helps prevent the A15 compound from dissociating and degrading the properties of the composite. For example, if lead is used as a matrix material, other A15 compounds not containing tin can be used.

Most generally, any chemical reactivity between the superconductor particles and metal matrix material should be avoided if it adversely effects the superconducting properties of the superconductor particles, the metal matrix materials, or the superconductor particle/metal matrix interface. In all the embodiments of the present invention, the particles are made of brittle superconducting materials. Any metal matrix material that promotes the chemical breakdown of the superconductor particles should be avoided. Lead is an example of a metal matrix material that promotes the chemical breakdown of $Nb_3Sn$.

Figure 12:
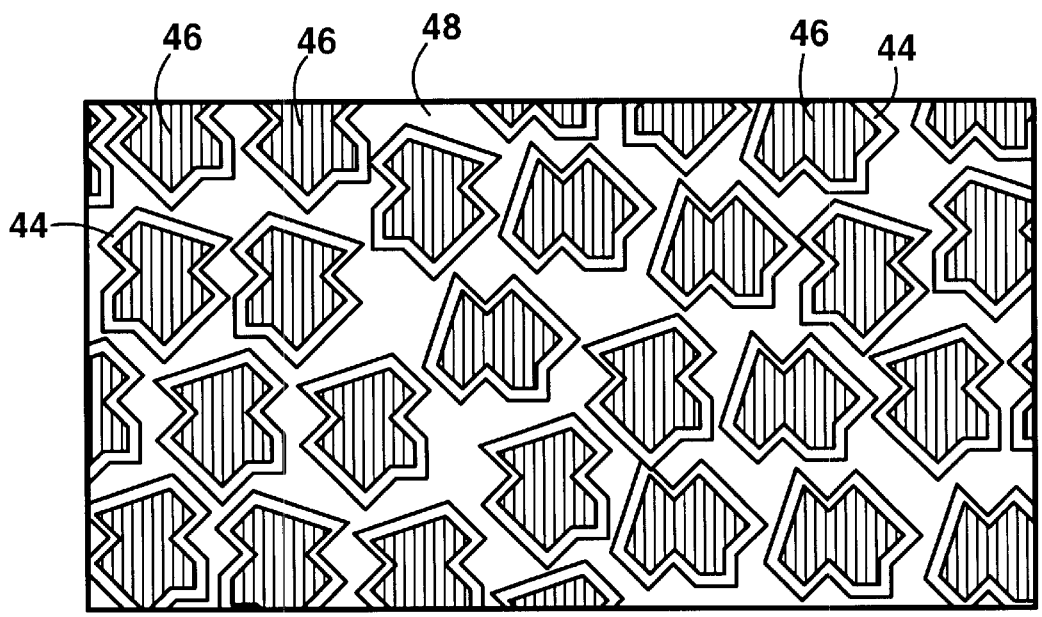
FIG. 12 is a cross-sectional view of an embodiment of the present invention where the superconductor particles are coated with a chemically compatible metal coating to chemically protect the superconductor particles from the metal matrix material.

FIG. 12 shows an alternative embodiment of the present invention which uses $Nb_3Sn$ superconductor particles 46 and lead as the matrix material 48. Each $Nb_3Sn$ superconductor particle 46 has a thin metal film coating 44 which prevents chemical reactions from occurring between the $Nb_3Sn$ superconductor particles 46 and lead matrix material 48. The coating is chemically compatible with the particles 46 and is chemically compatible with the metal matrix material 48. The coating 44 can be made of many different materials, but is preferably metallic and electrically conductive. The coating can be silver, for example. The coating 44 should be thin enough so that the proximity effect from the $Nb_3Sn$ superconductor particles 46 can reach the lead matrix material. This is preferably accomplished by making the coating 44 as thin as possible while still providing chemical isolation between the $Nb_3Sn$ superconductor particles and lead. More specifically, the coating should be substantially thinner than the inelastic electron mean free path (MFP) of the coating material at the temperature that composite material is used (e.g., the critical temperature of the particles). For silver, which does not react with Nb,Sn, the MFP is about 600 nanometers at 18 Kelvin, the $T_c$ for $Nb_3Sn$. More preferably, the coating thickness is less than ½ or ¼ of the electron MFP at the $T_c$ of the superconducting particles.

Preferably, the metal coating is thinner than an electron mean free path in the metal coating material at 4.2 Kelvin. Also, the metal coating is preferably thinner than a proximity effect decay length of the metal coating material at 4.2 Kelvin.

It is noted that metals with a long electron MFP tend to have low $\lambda$ values and are therefore are not susceptible to the proximity effect. However, a long mean free path in the coating increases the 'penetration' of the proximity effect through the coating. A coating material with a high $\lambda$ and short MFP will tend to reduce the proximity effect in the matrix, but in this case the coating itself will be more susceptible to the proximity effect. Generally, if a coating is applied to the superconductor particles, a balance is preferably provided between the coating thickness, electron mean free path, and $\lambda$ value. For example, a very thick silver coating (much thicker than the silver MFP) would be undesirable because the silver is not susceptible to the proximity effect, and the silver coating would reduce the proximity effect in the matrix. In general, if a low $\lambda$/high MFP coating is used, it should be as thin as possible while still preventing chemical reactions between the particles and matrix material. For example, 5–10 nanometers of silver can be sufficient for preventing certain chemical reactions, and the MFP for silver is much greater than 10 nm at temperatures necessary for superconductivity. If a high $\lambda$/low MFP coating is used, the optimal thickness depends on the coating $\lambda$ and the MFP, as well as the metal matrix material $\lambda$.

Table 4 shows several metals which can be used for a metal coating in cases where chemical incompatibility exists between the superconductor particles and the metal matrix material. The MFP increases with decreasing temperature. The MFP depends upon the microstructure of the material and so may vary from the values shown (e.g., depending on the process used to make the coating).

TABLE 4

Candidate metal coating metals

| Metal | Inelastic mean free path at 77 Kelvin |
| --- | --- |
| Silver | 285 nm |
| Gold | 205 nm |
| Aluminum | 131 nm |
| Copper | 328 nm |
| Tin | 100 nm |
| Lead | 141 nm |

Figure 13:
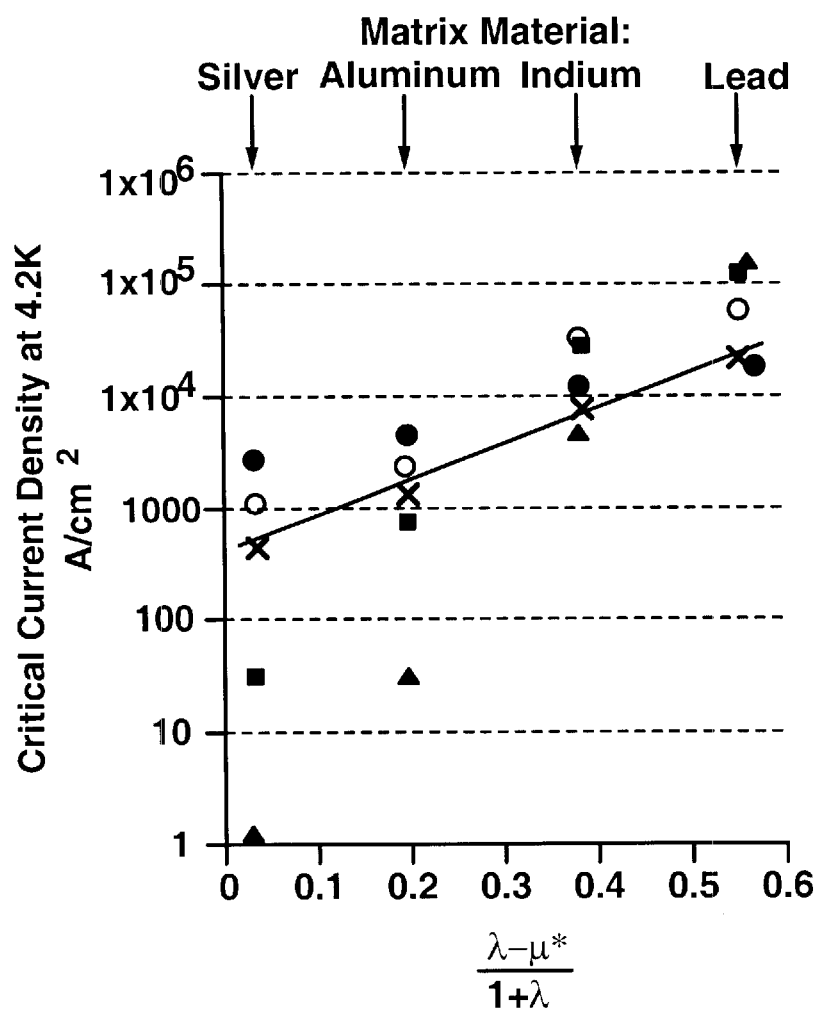
FIG. 13 is a graph of critical current density versus normalized electron-phonon coupling constant for the embodiment of FIG. 12 having a silver coating surrounding each superconductor particle.

FIG. 13 shows experimental results for four composites having $Nb_3Sn$ superconductor particles coated with about 100 nanometers of silver. The coated superconductor particles are disposed in silver, aluminum, indium or lead matrix materials (the silver coating is not considered part of the matrix material). The $J_c$'s for the four composites are indicated by X's. In each of the four composites, the silver coating comprises about 5% of the composite volume. The matrix material (silver, aluminum, indium, or lead) comprises about 15% of the composite volume. The silver coating prevents chemical reactions between the $Nb_3Sn$ superconductor particles and the lead matrix material, thereby preserving the integrity of the $Nb_3Sn$ superconductor particles. The important point here is that high-$\lambda$ metals (e.g., indium, lead) increase the $J_c$ of the composite compared to low-$\lambda$ matrix materials. This is remarkable considering that the matrix is separated from the $Nb_3Sn$ particles by 100 nanometers of silver. The proximity effect extends through the silver coating. If the proximity effect did not extend through the 100 nm silver coating, the $J_c$ for the indium and lead matrix composites would be the same as for the $Nb_3Sn$/silver matrix composite or essentially zero (i.e., less than 10 A/cm²). The fact that indium and lead dramatically increase the $J_c$ while not in direct physical contact with the superconductor particles is proof that the proximity effect extends through the silver coating. It is noted that the silver coating does negatively impact the wire performance somewhat. This negative impact is preferably minimized by reducing the thickness of the silver coating (e.g., to less than 10 nanometers). For example, a silver coating of 100 nanometers is unnecessarily thick, but can be used.

Figure 14:
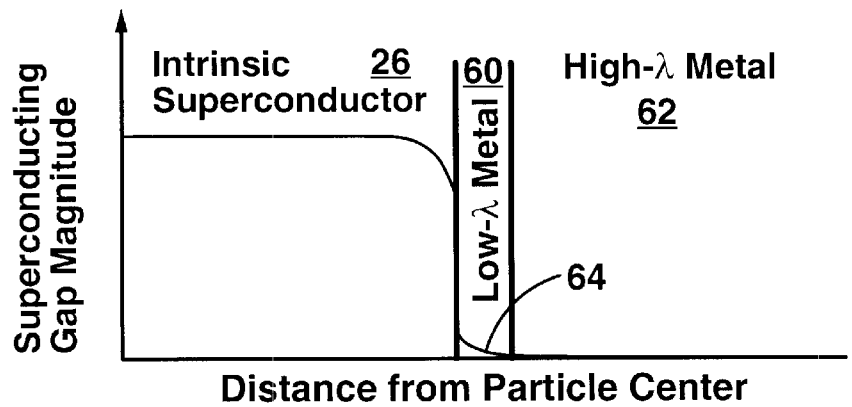
FIG. 14 is a graph illustrating the prevailing, incorrect model of the superconducting proximity effect in a 3-layer system.

Prior to the development of the present invention, it was mistakenly assumed by many in the field of superconductivity that the proximity effect could not extend through a thin layer of low-$\lambda$ metal (such as the noble metals in Table 6). FIG. 14 illustrates the prevailing but incorrect understanding of what was expected in such a 'three layer' system. The superconductor 26 is separated from a high-$\lambda$ metal 62 by a thin layer of low-$\lambda$ metal 60. The low-$\lambda$ metal has a very small superconducting gap 64 which is 'transmitted' to the high-$\lambda$ metal, thereby providing a very small superconducting gap magnitude in the high-$\lambda$ metal. This model of the proximity effect in the three layer system is absolutely incorrect.

Figure 15:
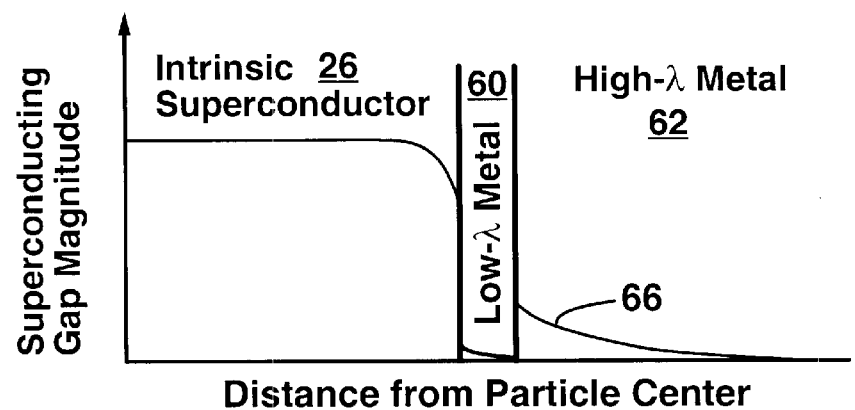
FIG. 15 is a graph illustrating the current model of the superconducting proximity effect in a 3-layer system, as developed by the present inventor.

FIG. 15 illustrates the correct model of the superconducting proximity effect in a three layer system, as developed by the present inventor. Remarkably and surprisingly, the superconducting gap magnitude 66 rebounds in the high-$\lambda$ metal to a value possibly much higher than the gap magnitude in the low-$\lambda$ metal 60. The ability of the gap magnitude to rebound in a three layer system has been confirmed in experiments performed by the present inventor. Of course, in order for the superconducting gap to rebound, the high-$\lambda$ metal preferably has a $\lambda$ substantially higher than the $\lambda$ of the low-$\lambda$ metal. The rebounding effect provides the physical basis of operation of the composite materials of the present invention which employ a low-$\lambda$ metal coating surrounding of the superconductor particles. For example, it is the rebounding effect which provides the improved $J_c$ in the composite material having silver-coated $Nb_3Sn$ superconductor particles in a lead matrix (explained with reference to FIGS. 12 and 13). It is important to note that the low-$\lambda$ metal does reduce the gap magnitude in the high-$\lambda$ metal somewhat. The negative impact of the low-$\lambda$ metal is minimized by making the low-$\lambda$ coating as thin as possible, and by using a low-$\lambda$ metal with a long MFP.

It is noted that, although the foregoing embodiments of the present invention have been primarily explained with reference to $Nb_3Sn$ as the superconductor particle material, the superconducting particles can be made of many other superconducting compounds and ceramics. Also, the superconducting particles can be made of a mixture of materials (i.e., each superconductor particle can be a mixture), or can be made of superconductor particles of different materials (i.e., different superconductor particles within the same composite can be made of different superconducting compounds or ceramics). The choice of superconductor particle material and matrix material is an important one, and depends upon the mechanical, electrical and chemical characteristics of the superconductor particles and matrix materials as well as the desired properties of the composite material (e.g., ductility, critical current density, n-value, critical temperature, chemical reactivity). For many material combinations, optimal volume ratios and superconductor particle sizes (e.g., producing the highest $J_c$, the highest $T_c$, the highest/lowest n-value, highest ductility) can be found by routine experimentation using the guidance and teaching of the present description.

The composites of the foregoing embodiments are in the form of single filament wire and are simple to manufacture using powder-in-tube methods known in the art. First, a powder of superconducting particles is thoroughly mixed with a metal matrix material. Each constituent material in the composition is preferably clean and free of contaminants. Also, the superconductor particles and matrix material should be free of insulating oxides or other non-conducting surface layers. Preferably, the superconductor particles and matrix material are handled in an inert atmosphere. The mixture is placed within a billet such as a copper, silver, aluminum, or rubber tube, though any non-reactive tube will work also. Next, the powder mixture is compressed in the billet, for example using a cold isostatic press. The compression step fuses the mixture into a densely packed composite material. Preferably, the compression step removes the majority of the voids from the composite material. Optionally, the compression step is performed in vacuum so that the void volume is minimized. Next, the billet containing the fused material is drawn into a wire using known wire drawing techniques. Annealing steps may be required between the drawing steps. It is noted that typical powder metallurgical techniques may leave voids comprising about 10–20% of the composite volume.

The relative volumes of the superconductor particles and metal matrix material is determined by the amount of the materials originally mixed together.

If it is desired to provide the superconductor particles with a noble metal coating (e.g., a silver coating), then this coating is preferably applied before mixing the superconductor particles with the metal matrix material. The coating can be applied using known chemical or physical deposition techniques.

An alternative method for making the composite material begins by coating the superconductor particles with a coating of metal matrix material. The thickness of the coating is preferably controlled accurately. The interface between the superconductor particles and the metal matrix material coating is preferably clean and free of grease, oxides and any other insulating contaminants. Next, to form a wire from the composite material, the metal matrix coated superconductor particles are placed in a billet, compressed, and drawn into a wire, preferably in an inert atmosphere. The relative volume ratio of the superconductor particles and metal matrix material is determined by the size of the superconductor particles and the thickness of the metal matrix material coating. Of course, the composite material of the present invention can be made into any other shape such as bars, rods, sheets, or plates.

A very special set of embodiments of the present invention employ the high temperature superconductor (HTS) ceramic materials (HTS ceramics). In the present specification, HTS ceramics are defined as ceramics having a critical temperature greater than 30 Kelvin. Several examples of suitable HTS ceramics are given in Table 4. The HTS ceramic $YBa_2Cu_3O_7$ is preferred for many applications (e.g., wire in high magnetic fields) because of its high flux pinning strength and high $T_c$.

TABLE 4

HTS ceramic superconductors

| HTS Ceramic | Critical Temperature, $T_c$ |
|---|---|
| $YBa_2Cu_3O_{10}$ | 95K |
| $Bi_2Sr_2Ca_2Cu_3O_{10}$ | 105K |
| $Bi_2Sr_2CaCu_2O_8$ | 85K |
| $(BiPb)_2Sr_2Ca_2Cu_3O_{10}$ | 110K |
| $Tl_2Ba_2Ca_2Cu_3O_{10}$ | 125K |
| $HgBa_2CaCu_2O_6$ | 135K |
| $HgBa_2Ca_2Cu_2O_6$ | 135K |
| $Tl_2Ba_2CuO_6$ | 80K |
| $La_{1.8}Sr_{0.15}CuO_4$ | 40K |
| $Tl_2Ba_2CaCu_2O_8$ | 105K |

The HTS ceramics listed above are strong oxidizing agents and will oxidize on contact all but the most noble (nonreactive) metals. Silver, gold, and palladium, for example, are not oxidized by contact with the HTS ceramics. However, these metals have very low electron-phonon coupling coefficients and are not very susceptible to the proximity effect. Table 5 lists the electron-phonon coupling coefficients for some noble metals not oxidized by the HTS ceramics.

TABLE 5

| Metal | Electron-phonon coupling, $\lambda$ |
|---|---|
| Silver | 0.14 |
| Gold | 0.14 |
| Palladium | <0.10(approximate) |

Generally, the noble metals have very low electron-phonon coupling coefficients. This explains why prior art composite superconductor wires made with HTS ceramic particles in a silver matrix have relatively low $J_c$ values and are sensitive to mechanical stress. In these wires, the supercurrent tends to flow directly between HTS ceramic particles where they are in direct contact. This is because the silver is not superconducting (or only slightly superconducting). Consequently, supercurrent paths are disturbed when the material is flexed. Silver, gold, and palladium are very weakly susceptible to the proximity effect due to their very low $\lambda$ values.

If HTS ceramic particles are disposed in a matrix of a non-noble metal (e.g., lead, indium, tin, NbTi or any other metals known to react with the HTS ceramics), an insulating metal oxide coating forms at the interface between the HTS ceramic particles and the non-noble metal. The metal oxide coating almost completely blocks the proximity effect and blocks supercurrent from flowing between adjacent HTS ceramic particles. A composite material having HTS ceramic particles in a matrix of oxidizable metal is almost completely useless as a superconductor due to the insulating metal oxide coating. The oxidizable non-noble metals cannot be combined with HTS ceramic particles in a composite material to make a useful superconducting composite employing the proximity effect.

There is presently no known material that resists oxidation by the HTS ceramics and has a high $\lambda$ (e.g., $\lambda$ greater than 1.0). If such a material is found or created, it could be combined with HTS ceramic particles in a composite to make a very high quality superconducting composite material with high $T_c$ and high $J_c$.

Figure 16:
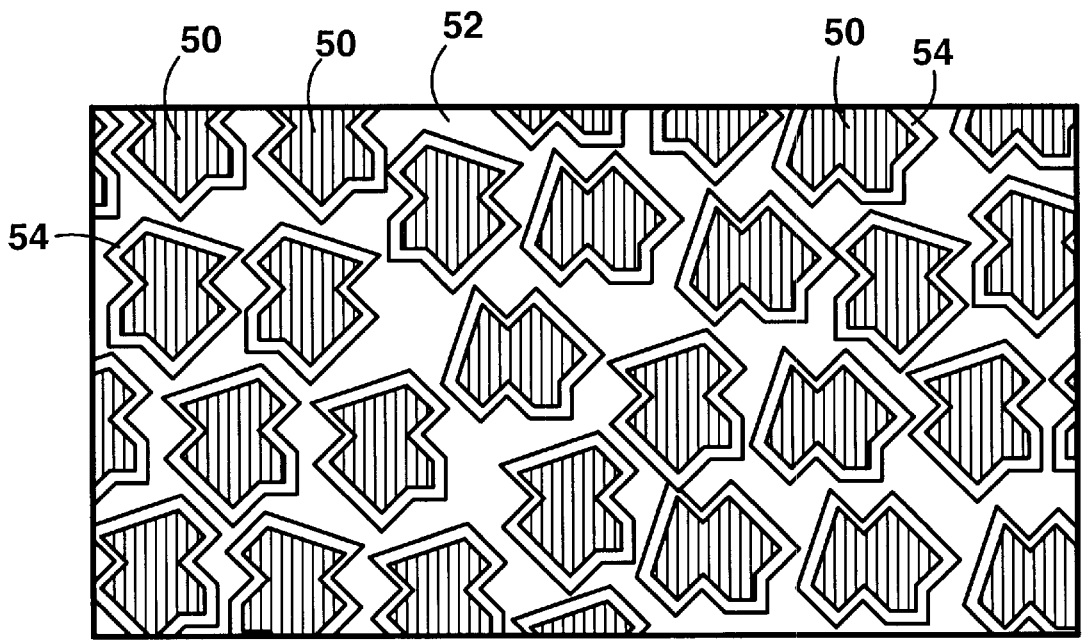
FIG. 16 is a cross-sectional view of an embodiment of the present invention using HTS ceramics as the superconducting particles. The particles are coated with a thin coating of noble metal that is not oxidized by the HTS ceramic particles.

FIG. 16 shows a view of a superconducting composite material according to the present invention that solves the above problems. The superconductor composite material has coated HTS ceramic particles 50 each having a noble metal coating 52. The coating 52 preferably completely surrounds each HTS ceramic particle 50. The noble metal coating 52 is preferably metallic and electrically conductive. The HTS ceramic particles 50 and coating 52 are disposed in a metal matrix material 54. The metal matrix material has a λ greater than 0.2, preferably greater than 0.5, more preferably greater than 1.0. All else being equal, the higher the λ of the metal matrix material, the better. The metal matrix material 54 is preferably selected from the materials listed in Table 2, although it is understood that Table 2 does not necessarily contain all the useful metal matrix materials. Any metal or metal alloy with a high enough λ, adequate ductility, and compatible chemical properties is suitable for use as the metal matrix material.

The HTS ceramic particles preferably have dimensions (not including the coating 52) larger than the superconducting coherence length of the HTS ceramic material. Typically, HTS ceramic materials have coherence lengths of about 1.5–3 nanometers, so the HTS ceramic particles preferably are at least this large. The HTS ceramic particles preferably have dimensions less than about 10 microns. Preferably, the HTS ceramic particles have dimensions of about 5–500 nanometers. Preferably, the HTS ceramic particles have dimensions of about 3–1000 times the superconducting coherence length of the HTS ceramic, or more preferably, about 3–50 times the coherence length. The best size range depends upon the temperature at which the composite material is used, the λ and the proximity effect decay length of the metal matrix material, among other factors.

The noble coating 52 is preferably made of a noble metal that does not react (i.e., is not oxidized) by contact with the HTS ceramic particles. Preferably, the coating is made of silver, although other metals in Table 5 can be used, as well as alloys of these metals. The metal matrix can include alloys comprising metals not listed in Table 5. For example, alloys of silver or gold with relatively more reactive metals may be nonreactive with the HTS ceramic. The noble coating 52 serves to prevent chemical reactions (e.g., oxidation) from occurring between the HTS ceramic particles and the metal matrix material 54. The noble coating 52 should be as thin as possible while thick enough to prevent chemical reactions between the HTS ceramic particles and metal matrix material 54. Preferably, the noble coating is about 5–50 nanometers thick, but the noble metal coating can also be as thick as 3000 nanometers. Thick noble coatings negatively impact or adversely affect the superconducting properties (e.g., $J_c$, $T_c$) of the composite superconducting material.

Silver is the preferred noble metal because it is the least expensive of the metals not oxidized by contact with HTS ceramics. Silver is also preferred because silver oxide is unstable at the modest temperatures used to anneal the HTS ceramic material, further inhibiting the formation and persistence of an oxide layer. Also, silver is permeable to oxygen at elevated temperature. This is beneficial because the HTS ceramics require a high oxygen content for superconductivity. If oxygen is depleted from the HTS ceramic material, superconductivity is degraded. HTS ceramic particles coated with silver can be replenished with oxygen because silver is permeable to oxygen at elevated temperature. The oxygen content of coated HTS ceramic particles is restored by heating the coated particles in an oxygen atmosphere.

Preferably, the noble metal coating is thinner than the inelastic electron mean free path (MFP) in the noble metal at the critical temperature of the superconducting particles. More preferably, the metal coating is thinner than ½ or ¼ of the electron MFP of the coating at the critical temperature of the superconducting particles.

A long MFP allows electrons and holes from the HTS ceramic particles to travel a long distance in the noble metal. This increases the probability that electrons and holes will reach the metal matrix material without collisions and thereby provide a substantial superconducting gap in the metal matrix material. In other words, a long MFP in the noble metal increases the superconducting gap magnitude in the metal matrix material. Silver is also preferred because of its relatively long MFP. Again, it is emphasized that the noble metal coating should be as thin as possible while still providing chemical isolation for the HTS ceramic particles.

Also, it is preferable for the noble metal coating to be thinner than the proximity effect decay length of the noble metal at the critical temperature of the superconducting particles. Proximity effect decay lengths are typically shorter than the MFP for noble metals, and the proximity effect decay length is inversely proportional to temperature. The proximity effect decay length is determined by the rate of dephasing of electron and electron-hole wave functions in the noble metal. The dephasing is caused by differences in the electron and hole velocities. The proximity effect decay length is known and understood in the art. Table 6 gives the proximity effect decay lengths for some noble metals at 77 Kelvin.

TABLE 6

| Noble Metal | Proximity effect decay length at 77 Kelvin |
| --- | --- |
| Silver | 22 nm |
| Gold | 22 nm |
| Palladium | 27 nm |

Figure 17:
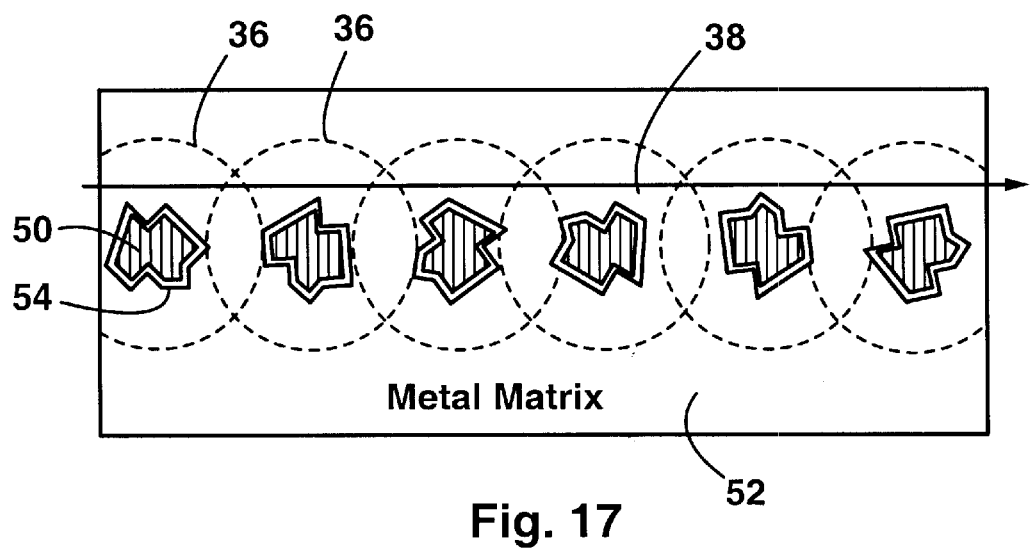
FIG. 17 illustrates how the embodiment of FIG. 16 provides a continuous supercurrent path through the matrix material.

FIG. 17 illustrates the operation of the embodiments employing HTS ceramic particles 50 with a noble metal coating 54. When cooled below the HTS ceramic $T_c$, a proximity effect extends into the metal matrix material 52 a certain range illustrated by the circles 36. It is understood that the proximity effect extends through the noble metal coating 54 and into the metal matrix material 52 according to the model explained with reference to FIG. 15. The superconducting gap rebounds in the metal matrix material 52. The proximity effect decays with distance from the HTS particles 50 so that the circles provide an arbitrary measurement of the proximity effect range. The particles 50 are close enough together so that the circles 36 overlap, thereby providing a continuous supercurrent path 38. The overlapping circles means that the particles 50 are coupled by the continuous superconducting path due to the proximity effect. Circle size increases with decreasing noble metal coating thickness.

A method for preparing the HTS ceramic composite superconductor material begins with providing clean HTS ceramic particles of appropriate sizes. The HTS ceramic particles are then coated with a thin, uniform coating of noble metal, preferably silver. Silver can be deposited using a number of techniques known in the art such as chemical deposition and vapor deposition. Vapor deposition can be performed by sifting the particles in a vacuum chamber having a partial pressure of silver, for example. Other techniques for forming the noble metal coating are known in the art.

After the HTS ceramic particles are coated with silver, the interior of the HTS ceramic particles can be replenished with oxygen. Replenishment is performed by heating the coated particles in an atmosphere with a partial pressure of oxygen. Since silver is permeable to oxygen at elevated temperatures (300° C. and up), oxygen reaches the ceramic. The best temperature, oxygen pressure, and annealing time is specific to each HTS ceramic and is selected to optimize the superconducting properties of each ceramic. Such annealing techniques for silver coated high $T_c$ ceramics are well known in the art The coated HTS ceramic particles are then thoroughly mixed with particles of the metal matrix material. The ratio of HTS ceramic particles to metal matrix material particles determines the average spacing between the HTS ceramic particles. The mixing ratio has a large effect upon the superconducting properties of the composite material and should be optimized for a particular application. To form the composite into a wire, the mixture is then disposed in a metal billet and compressed to fuse the mixture into a densely packed composite material. Compression may be performed under vacuum so that void space is minimized. The densely packed composite material is then drawn into a wire using conventional techniques. Of course, the ceramic particles and metal matrix particles can be compressed to form any other shape such as bars, rods, sheets, or plates.

Alternatively, the coated HTS ceramic particles are coated with the metal matrix material. The twice coated HTS ceramic particles are then compressed in a billet and drawn into a wire.

The present invention provides a new class of superconducting composite materials that are designed to maximize the superconducting proximity effect. The metal matrix material is selected based on its electron-phonon coupling coefficient $\lambda$, and its chemical compatibility. In cases where a chemical incompatibility exists between the intrinsic superconductor particles and the metal matrix material (as in the case of the HTS ceramics and the $Nb_3Sn$/lead combination), a noble metal coating protects the superconductor particles. In the case of the HTS ceramics, the metal coating is preferably a noble metal coating that resists oxidation. For many other superconductor particles, the coating can be any metal compatible with other materials in the composite. If the metal coating is thin enough, and has a long enough MFP, the proximity effect causes the surrounding metal matrix material to become superconducting due to the proximity effect.

It is noted that the present invention includes many possible combinations of superconductor particle materials and metal matrix materials. Any superconductor particles can be combined with any high-$\lambda$ metal matrix material. If a chemical incompatibility exists in the combination (e.g., the combination causes degradation of the superconductor particles or degradation of the metal matrix material, or an insulating coating forms at the superconductor particle/metal matrix interface), then a chemically-insulating, electrically conductive coating should be provided between the superconductor particles and the metal matrix material. The coating is preferably a noble metal if the superconductor particles are highly reactive, such as many of the HTS ceramics.

For superconductor particle materials that are less reactive than the HTS ceramics, the coating can be made of metals other than silver, gold and palladium. For example, the coating can be made of high $\lambda$ metals that are readily oxidizable. However, the coating is preferably nonreactive with the particles and the metal matrix material.

The present invention is not limited to the superconductor particle material and metal matrix materials listed herein.

It is not necessary in the present invention to only select materials that do not react at all with one another. A certain amount of reactivity can be tolerated between the different components if the reactivity does not significantly damage the superconducting properties of the composite. For example, $Nb_3Sn$/lead composite demonstrates some amount of damaging reactivity, but $Nb_3Sn$/lead composite is still useful as a superconductor for certain applications and is within the scope of the present invention. The present invention covers any material combinations that do not destroy superconductivity in one of the material components, or does not form electrically insulating layers (e.g., metal oxides) at interfaces between the components.

It will be clear to one skilled in the art that the above embodiments may be altered in many ways without departing from the scope of the invention. Accordingly, the scope of the invention should be determined by the following claims and their legal equivalents.

What is claimed is:

1. A superconducting composite material comprising:
   a) a plurality of superconductor particles made of a superconductor material, wherein the superconductor particles have dimensions larger than a superconducting coherence length of the superconductor material;
   b) a metal matrix material filling regions between the superconductor particles, wherein the metal matrix material has an electron-boson coupling coefficient greater than 0.2, and wherein the superconductor particles are electrically coupled to each other due to the proximity effect when cooled below the critical temperature of the superconductor material.

2. The superconducting composite material of claim 1 wherein the superconductor particles have dimensions in the range of 2 nanometers to 10 microns.

3. The superconducting composite material of claim 1 wherein the superconductor particles have dimensions in the range of 10–500 nanometers.

4. The superconducting composite material of claim 1 wherein the superconductor material and the metal matrix material are chemically nonreactive with each other.

5. The superconducting composite material of claim 1 wherein the superconductor material is selected from the group consisting of A15 compounds, AB family superconductors, Laves phase superconductors, and Chevrel phase superconductors.

6. The superconducting composite material of claim 1 wherein the superconductor material is an HTS ceramic.

7. The superconducting composite material of claim 1 wherein the metal matrix material has an electron-boson coupling coefficient greater than 0.5.

8. The superconducting composite material of claim 1 wherein the metal matrix material has an electron-boson coupling coefficient greater than 0.72.

9. The superconducting composite material of claim 1 wherein the metal matrix material has an electron-boson coupling coefficient greater than 1.0.

10. The superconducting composite material of claim 1 wherein the metal matrix material is made of a metal selected from the group consisting of mercury, tantalum, titanium, vanadium, titanium/bismuth alloys, lead/titanium alloys, niobium, indium, NbTi alloy, tin, lead, lead/bismuth alloys, and alloys thereof.

11. The superconducting composite material of claim 1 wherein the superconductor particles have dimensions of 3–500 times the superconducting coherence length of the superconductor material.

12. The superconducting composite material of claim 1 wherein the metal matrix material comprises a mixture of different metals.

13. The superconducting composite material of claim 12 wherein the mixture of metals comprises a metal with an electron-boson coupling coefficient less than 0.2.

14. A superconducting composite material comprising:
   a) a plurality of superconductor particles made of a superconductor material, wherein the superconductor particles have dimensions larger than a superconducting coherence length of the superconductor material;
   b) a metal matrix material disposed between the superconductor particles, wherein the metal matrix material has an electron-boson coupling coefficient greater than 0.2,
   c) a metal coating covering each superconductor particle, wherein the metal coating is thick enough to prevent chemical reactions between the superconductor particles and the metal matrix material, wherein the metal coating is chemically compatible with the superconductor material, wherein the metal coating is chemically compatible with the metal matrix material, and wherein the superconductor particles are electrically coupled due to the proximity effect when cooled below the critical temperature of the superconductor material.

15. The superconducting composite material of claim 14 wherein the metal coating and the superconductor material are chemically nonreactive with each other.

16. The superconducting composite material of claim 14 wherein the superconductor particles are made of HTS ceramic and the metal coating is made of a metal not oxidized by contact with the HTS ceramic.

17. The superconducting composite material of claim 15 wherein the superconductor particles are made of a ceramic selected from the group consisting of $BaPb_{0.7}Bi_{0.3}O_3$, $La_{1.85}Sr_{0.15}CUO_4$, $HgBa_2CaCu_2O_6$, $HgBa_2Ca_2Cu_2O_6$, $Tl_2Ba_2CuO_6$, $YBa_2Cu_3O_7$, $Bi_2Sr_2Ca_2CU_3O_{10}$, $Bi_2Sr_2CaCu_2O_8$, $(BiPb)_2Sr_2Ca_2Cu_3O_{10}$, $Tl_2Ba_2Ca_2Cu_3O_{10}$, and $Tl_2Ba_2CaCU_2O_8$.

18. The superconducting composite material of claim 14 wherein the metal coating is made of a metal selected from the group consisting of silver, gold, palladium, and alloys thereof.

19. The superconducting composite material of claim 14 wherein the metal coating is thinner than an electron mean free path length in the metal coating material at 4.2 Kelvin.

20. The superconducting composite material of claim 14 wherein the metal coating is thinner than a proximity effect decay length in the metal coating material at 4.2 K.

21. The superconducting composite material of claim 14 wherein the metal coating is thinner than ½ of an electron mean free path length in the metal coating material at 4.2 K.

22. The superconducting composite material of claim 14 wherein the metal coating is thinner than ½ of a proximity effect decay length in the metal coating material at 4.2 K.

23. The superconducting composite material of claim 14 wherein the metal coating is in the range of 3 to 200 nanometers thick.

24. The superconducting composite material of claim 14 wherein the metal coating is in the range of 2 to 50 nanometers thick.

25. The superconducting composite material of claim 14 wherein the superconductor material is selected from the group consisting of A15 compounds, AB family superconductors, Laves phase superconductors, and Chevrel phase superconductors.

26. The superconducting composite material of claim 14 wherein the metal matrix material has an electron-boson coupling coefficient greater than 0.5.

27. The superconducting composite material of claim 14 wherein the metal matrix material has an electron-boson coupling coefficient greater than 0.72.

28. The superconducting composite material of claim 14 wherein the metal matrix material has an electron-boson coupling coefficient greater than 1.0.

29. The superconducting composite material of claim 14 wherein the metal matrix material has an electron-boson coupling coefficient greater than 1.5.

30. The superconducting composite material of claim 14 wherein the metal matrix material is made of a metal selected from the group consisting of mercury, tantalum, titanium, vanadium, titanium/bismuth alloys, lead/titanium, niobium, indium, NbTi alloy, tin, lead, lead/bismuth alloys, and alloys thereof.

31. The superconducting composite material of claim 14 wherein the superconductor particles have dimensions of 3–500 times the superconducting coherence length of the superconductor material.

32. The superconducting composite material of claim 14 wherein the metal matrix material comprises a mixture of different metals.

33. The superconducting composite material of claim 32 wherein the mixture of metals comprises a metal with an electron-boson coupling coefficient less than 0.2.

34. A method for making a superconducting composite material, comprising the steps of:
   a) forming a plurality of superconductor particles made of a superconductor material;
   b) coating the superconductor particles with a metal coating to form coated particles, wherein the metal coating does not negatively affect the superconducting properties of the superconductor particles;
   c) forming a multitude of particles of a metal matrix material, wherein the metal matrix material has an electron-boson coupling coefficient greater than 0.2.
   d) mixing the metal matrix material particles and the coated particles into a mixture; and
   e) fusing the mixture to form a solid material.

35. The method of claim 34 wherein the superconductor material is an HTS ceramic material, and wherein the metal coating is made of a metal that is not oxidized by contact with the HTS ceramic material.

36. The method of claim 34 wherein step (b) is performed by agitating the superconductor particles in a sealed chamber containing a vapor of the metal coating material.

37. The method of claim 34 wherein step (e) is performed in a vacuum.

38. The method of claim 34 wherein step (d) is performed in an inert atmosphere.

39. A composite superconducting material comprising:
   a) a plurality of particles composed of a superconductor particle material, wherein each of the particles has physical dimensions larger than a superconducting coherence length of the superconductor particle material; and
   b) a matrix material filling regions between the particles; wherein the matrix material is a superconductor having an electron-phonon coupling coefficient of at least 0.72 and a superconducting critical temperature less than a superconducting critical temperature of the superconductor particle material;
   wherein, at a temperature greater than the superconducting critical temperature of the matrix material and less than the superconducting critical temperature of the superconductor particle material, the particles induce the regions of the matrix material between the particles to be superconducting.

40. The composite superconducting material of claim 39 wherein the superconductor particle material is an A15 compound.

41. The composite superconducting material of claim 39 wherein the superconductor particle material is a high-$T_c$ oxide.

42. The composite superconducting material of claim 39 wherein the composite superconductor material further comprises a coating material covering each of the particles of superconductor particle material.

43. The composite superconducting material of claim 42 wherein the coating material is chemically nonreactive with the superconductor particle material.

44. The composite superconducting material of claim 43 wherein the coating material has a thickness less than a superconducting proximity effect decay length of the coating material at 4.2 K.

45. The composite superconducting material of claim 43 wherein the coating material is a metal having an electron-phonon coupling coefficient between 0.1 and 0.2.

46. The composite superconducting material of claim 43 wherein the coating material comprises silver.

47. The composite superconducting material of claim 39 in the form of a wire.

48. A method for producing a composite superconducting material, the method comprising:
   a) coating a plurality of particles composed of superconductor particle material with a coating material chemically nonreactive with the superconductor particle material; wherein the particles have physical dimensions larger than a superconducting coherence length of the superconductor particle material; and
   b) mixing the coated particles with a matrix material, not necessarily distinct from the coating material; wherein the matrix material is a superconductor having an electron-phonon coupling coefficient greater than 0.72 and a superconducting critical temperature less than a superconducting critical temperature of the superconductor particle material.

49. The method of claim 48 wherein the superconductor particle material is an A15 compound.

50. The method of claim 48 wherein the superconductor particle material is a high-$T_c$ oxide.

51. The method of claim 48 wherein each of the coated particles has a layer of coating material having a thickness less than a superconducting proximity effect decay length of the coating material at 4.2 K.

52. The method of claim 48 wherein the coating material is a metal having an electron-phonon coupling coefficient between 0.1 and 0.2.

53. The method of claim 48 wherein the coating material comprises silver.

54. A method for producing a composite superconducting material, the method comprising:
   mixing a plurality particles composed of superconductor particle material with a matrix material chemically nonreactive with the superconductor particle material;
   wherein the particles have physical dimensions larger than a superconducting coherence length of the superconductor particle material;
   wherein the matrix material is a superconductor having an electron-phonon coupling coefficient greater than 0.72 and a superconducting critical temperature less than a superconducting critical temperature of the superconductor particle material.

55. The method of claim 54 wherein the superconductor particle material is an A15 compound.

56. The method of claim 54 wherein the superconductor particle material is a high-$T_c$ oxide.

57. The method of claim 54 further comprising coating the particles with a coating material not necessarily distinct from the matrix material.

58. The method of claim 57 wherein the coating material is chemically nonreactive with the superconductor particle material.

59. The method of claim 57 wherein the coating material has a thickness less than a superconducting proximity effect decay length of the coating material at 77 K.

60. The method of claim 57 wherein the coating material is a metal having an electron-phonon coupling coefficient between 0.1 and 0.2.

61. The method of claim 57 wherein the coating material comprises silver.

* * * * *